(12) United States Patent
Kasuga

(10) Patent No.: US 9,057,811 B2
(45) Date of Patent: Jun. 16, 2015

(54) COOLING STRUCTURE FOR LIGHT EMITTING ELEMENTS FOR LIQUID CRYSTAL PANEL

(75) Inventor: Hiroyuki Kasuga, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 121 days.

(21) Appl. No.: 13/820,738

(22) PCT Filed: Sep. 7, 2010

(86) PCT No.: PCT/JP2010/065266
§ 371 (c)(1),
(2), (4) Date: Mar. 4, 2013

(87) PCT Pub. No.: WO2012/032599
PCT Pub. Date: Mar. 15, 2012

(65) Prior Publication Data
US 2013/0163285 A1    Jun. 27, 2013

(51) Int. Cl.
| | | |
|---|---|---|
| *F21V 7/20* | (2006.01) | |
| *F21V 8/00* | (2006.01) | |
| *H05K 1/02* | (2006.01) | |
| *H01L 33/64* | (2010.01) | |
| *G02F 1/1335* | (2006.01) | |

(52) U.S. Cl.
CPC ............ *G02B 6/0085* (2013.01); *H05K 1/0272* (2013.01); *H05K 1/0206* (2013.01); *H01L 33/64* (2013.01); *G02F 2001/133628* (2013.01)

(58) Field of Classification Search
CPC .... H01L 33/64; H05K 1/0272; H05K 1/0206; H05K 2201/09063; G02B 6/0085
USPC ............................. 362/612–613, 294, 373, 218
See application file for complete search history.

(56) References Cited

U.S. PATENT DOCUMENTS

| | | | | |
|---|---|---|---|---|
| 6,043,986 | A * | 3/2000 | Kondo et al. ............... | 361/720 |
| 6,753,553 | B2 * | 6/2004 | Wu .............................. | 257/88 |
| 6,902,299 | B2 * | 6/2005 | Zhan et al. .................. | 362/294 |
| 7,311,431 | B2 * | 12/2007 | Chew et al. ................. | 362/613 |
| 8,338,852 | B2 * | 12/2012 | Hochstein ................... | 257/99 |
| 8,668,355 | B2 * | 3/2014 | Moriyama et al. ......... | 362/249.01 |

FOREIGN PATENT DOCUMENTS

| | | | |
|---|---|---|---|
| JP | 2005-283852 A | 10/2005 | |
| JP | 2009-037212 A | 2/2009 | |
| JP | 2009-146904 A | 7/2009 | |

OTHER PUBLICATIONS

International Search Report in PCT/JP2010/065266 dated Oct. 19, 2010 (English Translation Thereof).

\* cited by examiner

*Primary Examiner* — Robert May
(74) *Attorney, Agent, or Firm* — McGinn IP Law Group, PLLC

(57) ABSTRACT

A cooling structure for light emitting elements for a liquid crystal panel according to the present invention includes: a long-shaped substrate that is disposed so as to extend along an edge of a light guide plate provided on a rear surface of a liquid crystal panel, and in which a plurality of through-holes are formed; a plurality of light emitting elements that are disposed on a front surface of the substrate so as to face the light guide plate; and a chassis that is provided at a rear surface side of the substrate, and the through-holes are arranged at a higher density at a center portion of the substrate in a long direction than at end portions of the substrate in the long direction.

18 Claims, 4 Drawing Sheets

COOLING STRUCTURE FOR LIGHT EMITTING ELEMENTS FOR LIQUID CRYSTAL PANEL

TECHNICAL FIELD

The present invention relates to a cooling structure for light emitting elements for a liquid crystal panel that is arranged so as to extend along an edge of a light guide plate at the rear surface of a liquid crystal panel.

BACKGROUND ART

Conventionally, as the light source of a lighting system for a non-luminescent and transmissive display device such as a liquid crystal display, a cold-cathode tube has been used the most, but in recent years from the standpoint of wide color reproduction and environmental considerations (mercury-free), liquid crystal panels that adopt LEDs (light emitting diodes) as backlights are increasing.

In current LEDs, since the light emitting intensity per unit is small compared to a cold-cathode tube, it is necessary to arrange a plurality of LEDs in a lighting system in order to obtain the desired brightness. Here, when a plurality of LEDs are arranged uniformly in a lighting system, and all the LEDs are lighted with the same drive conditions (crest value of the drive current and drive current panel width being the same), the brightness of the light emitting surface of the lighting system becomes darker near the edges compared to the center portion. This is because the cumulative light quantity decreases the further toward the edge.

Therefore, with the object of making the brightness of a light emitting surface of a lighting system uniform at the center and the edges, an LED arrangement format known as a so-called side-lamp type has conventionally been proposed (for example, refer to Patent Document 1). Here, FIG. 7 is a schematic perspective diagram that shows a liquid crystal panel unit (90) according to a conventional example in which the side-lamp type is adopted. In the liquid crystal panel (90), optical films (92), a light guide plate (93) and a reflecting plate (94) are arranged on the rear surface of a liquid crystal panel (91), with a substrate (95) of an LED back array (side-lamp type) in which LEDs (not shown) are arranged in a linear manner at a fixed interval being disposed so as to extend along the edge of the light guide plate (93).

PRIOR ART DOCUMENTS

Patent Documents

[Patent Document 1] Japanese Unexamined Patent Application, First Publication No. 2009-146904

SUMMARY OF THE INVENTION

Problem to be Solved by the Invention

However, with a conventional liquid crystal panel unit (90) that adopts the side-lamp type, since LEDs are arranged in a linear manner at a fixed interval on the rectangular substrate (95), as shown in FIG. 8, the temperature of the LEDs has a tendency to become highest near the center portion in the long direction which is heated from both end portions, and gradually decrease heading from there to the end portions in the long direction.

Also, generally an LED is characterized by changes in its properties due to heat being greater than a conventional cold-cathode tube, and in particular when the temperature increases, the brightness decreases and the longevity becomes shorter compared to the case of the temperature being low.

Accordingly, in the conventional liquid crystal panel unit (90), due to a temperature difference occurring between the center portion in the long direction and the ends in the long direction, there is the problem of uniformity of brightness along the long direction not being obtained, and in the case of being used over a long term, there has been the problem of the LED degrading early in the center portion in the long direction compared to the ends in the long direction.

The present invention was achieved in view of the aforementioned conventional problems, and provides a cooling structure for light emitting elements for a liquid crystal panel that can make the light emitting elements for a liquid crystal panel that is arranged on the rear surface of a liquid crystal panel have a uniform temperature distribution.

Means for Solving the Problem

In order to resolve the aforementioned issues, a cooling structure for light emitting elements for a liquid crystal panel according to the present invention includes: a long-shaped substrate that is disposed so as to extend along an edge of a light guide plate provided on a rear surface of a liquid crystal panel, and in which a plurality of through-holes are formed; a plurality of light emitting elements that are disposed on a front surface of the substrate so as to face the light guide plate; and a chassis that is provided at a rear surface side of the substrate, and the through-holes are arranged at a higher density at a center portion of the substrate in a long direction than at end portions of the substrate in the long direction.

Effect of the Invention

According to the cooling structure for light emitting elements for a liquid crystal panel according to the present invention, at the center portion in the long direction where the temperature of LEDs is high, a large amount of the heat is conveyed from the LEDs to the chassis through the through-holes that are arranged at a high density. On the other hand, at the end portions in the long direction where the temperature of the LEDs is low, a small amount of the heat is conveyed from the LEDs to the chassis through the through-holes that are arranged at a low density. Thereby, since a temperature difference does not occur between the LEDs at the center portion of the substrate in the long direction thereof and the end portions of the substrate in the long direction thereof, uniformity of brightness along the long direction is obtained, and it is possible to reduce the difference in longevity between the LEDs at the center portion in the long direction and at the end portions in the long direction.

EMBODIMENTS FOR CARRYING OUT THE INVENTION

Figure 7:
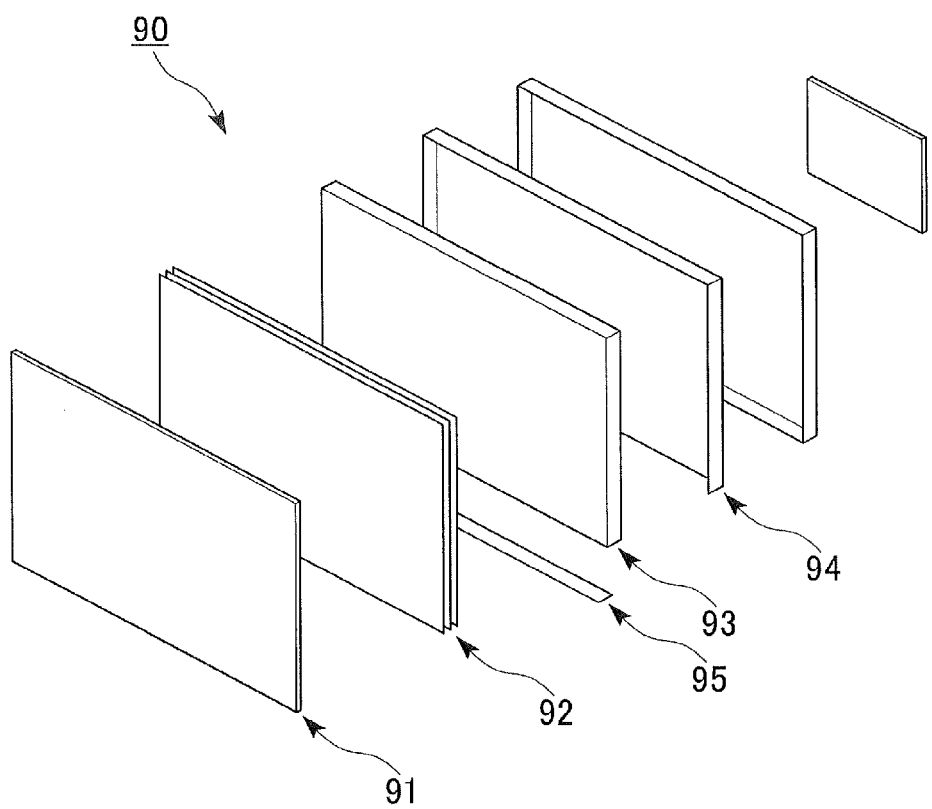
FIG. 7 is a schematic perspective view that shows a liquid crystal panel unit according to a conventional example that adopts a side-lamp type.
Figure 8:
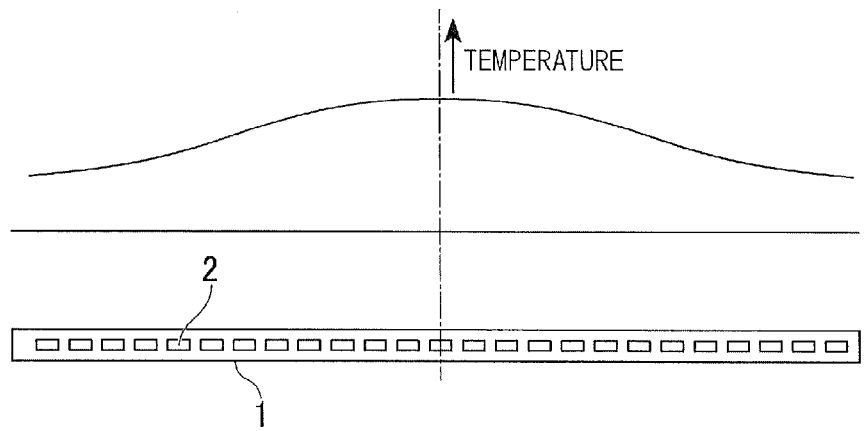
FIG. 8 is a graph that shows the relation between the position and temperature of LEDs in an LED substrate that is adopted in a back light for a typical liquid crystal panel.

Hereinbelow, a cooling structure for light emitting elements for a liquid crystal panel according to exemplary embodiments of the present invention shall be described in detail, referring to the drawings. Note that since the liquid crystal panel unit that includes the cooling structure for light emitting elements for a liquid crystal panel according to the exemplary embodiments of the present invention has the same structure as the conventional liquid crystal panel unit (90) shown in FIG. 7, its description shall be omitted here.

Figure 1:
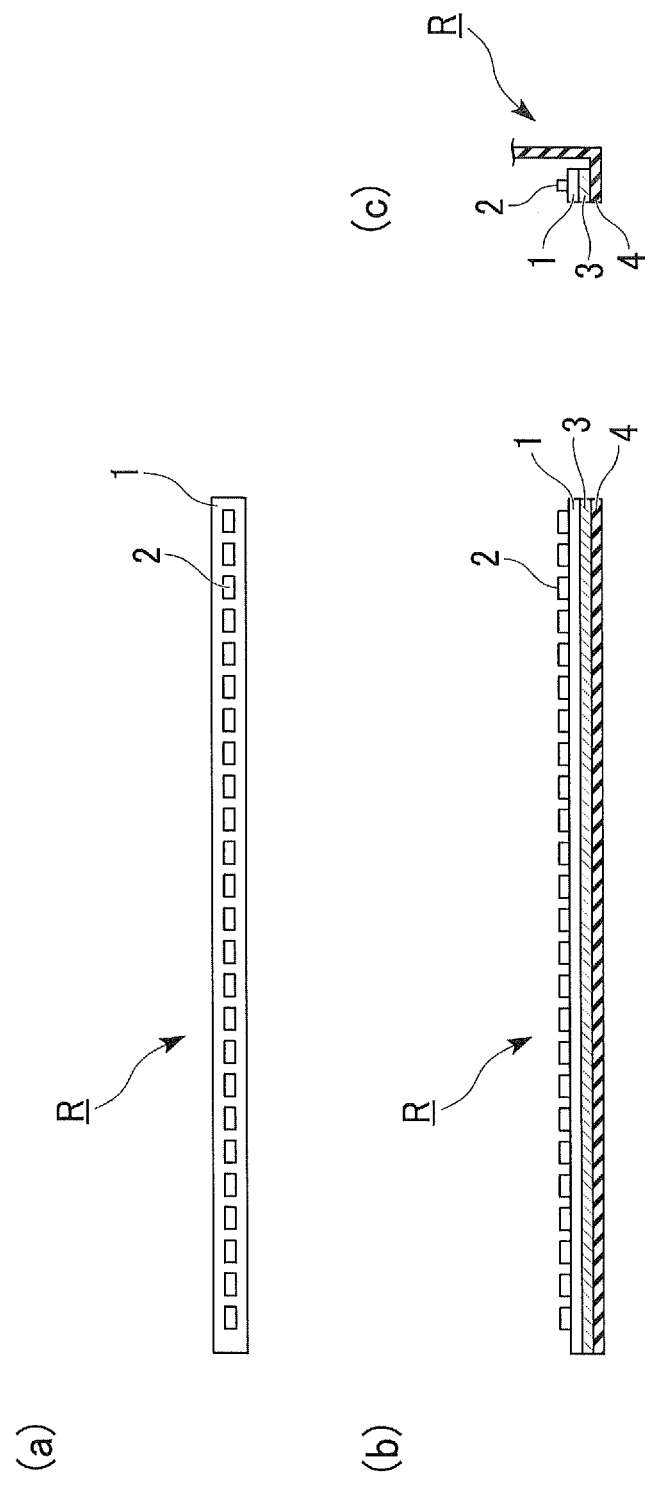
FIG. 1 is a diagram that shows a cooling structure for light emitting elements for a liquid crystal panel according to a first exemplary embodiment of the present invention, with FIG. 1(a) being a plan view, FIG. 1(b) being a cross-sectional view in the long direction of a substrate, and FIG. 1(c) being a cross-sectional view in the short direction of the substrate.

FIG. 1 is a diagram that shows a cooling structure (R) for light emitting elements for a liquid crystal panel according to a first exemplary embodiment of the present invention, with FIG. 1(a) being a plan view, FIG. 1(b) being a cross-sectional view in the long direction of a substrate, and FIG. 1(c) being a cross-sectional view in the short direction of the substrate.

The cooling structure (R) for light emitting elements for a liquid crystal panel according to the first exemplary embodiment has a long rectangular shape, and includes a substrate (1) in which a plurality of through-holes (H) are formed penetratingly, a plurality of LEDs (2) (light emitting elements) that are arranged in a linear manner at a fixed interval on the front surface of this substrate (1), and a chassis (4) that has a heat dissipating function that is mechanically and thermally joined to the rear surface of the substrate (1) via a thermally conductive adhesive sheet (3).

The plurality of through-holes (H) are formed penetratingly in the substrate (1) as shown in FIG. 1. The inner periphery of each through-hole (H) is plated with copper foil. Also, although not shown in detail in the figure, a copper foil pattern of a predetermined thickness is formed on the front surface of the substrate (1). Furthermore, this substrate (1) attains a mechanical bond with the chassis (4) due to interposition of the thermally conductive adhesive sheet (3), and attains a good connection relation with the chassis (4) from the aspect of thermal conduction.

The LED (2) functions as a lighting device for a liquid crystal panel, and for example it is possible to apply one in which a red LED, a green LED, and a blue LED are mounted in the same package. The plurality of LEDs (2) that are constituted in this manner are arranged in a linear manner at a fixed interval by being respectively fixed by soldering to the front surface of the substrate (1).

Figure 2:
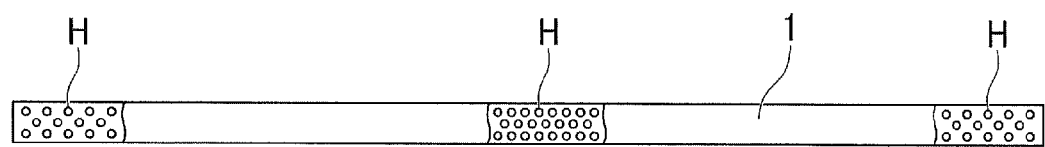
FIG. 2 is a schematic plan view that shows the constitution of a substrate according to the first exemplary embodiment of the present invention.

FIG. 2 is a schematic plan view that shows the constitution of the substrate (1) according to the first exemplary embodiment. The plurality of through-holes (H) are formed penetratingly along the entire length of the substrate (1) in the long direction thereof as described above. These through-holes (H) are arranged at a higher density at the center portion of the substrate (1) in the long direction thereof than at the end portions in the long direction thereof. That is to say, the through-holes (H) are provided most densely at the center portion of the substrate (1) in the long direction thereof, and gradually become more sparse heading toward the end portions in the long direction thereof.

Figure 3:
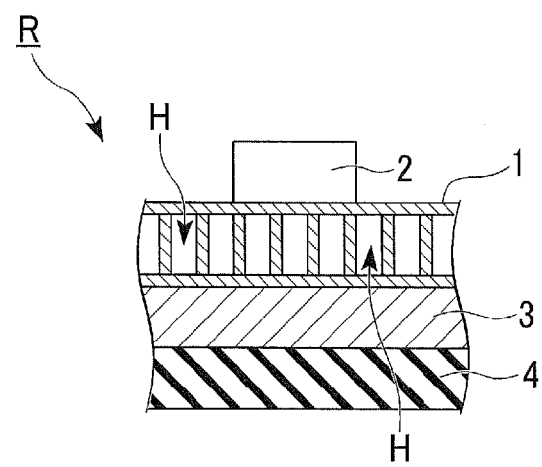
FIG. 3 is a diagram that shows a cross-section in the long direction of the substrate according to the first exemplary embodiment of the present invention, being an enlarged partial cross-sectional view that enlarges a center portion in the long direction.
Figure 4:
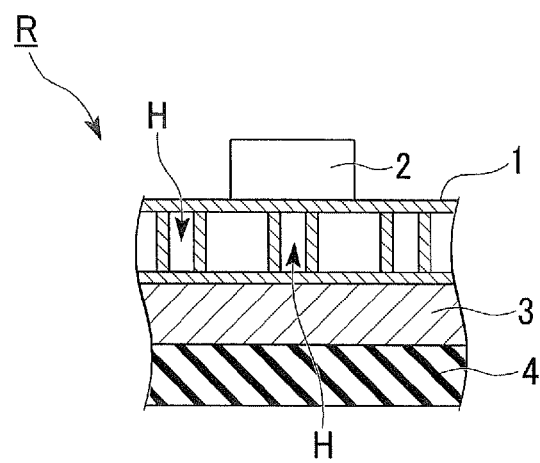
FIG. 4 is diagram that shows a cross-section in the long direction of the substrate according to the first exemplary embodiment of the present invention, being an enlarged partial cross-sectional view that enlarges an end portion in the long direction.

FIG. 3 and FIG. 4 are diagrams that show cross-sections in the long direction of the substrate according to the first exemplary embodiment of the present invention, with FIG. 3 being an enlarged partial cross-sectional view that enlarges the center portion in the long direction, and FIG. 4 being an enlarged partial cross-sectional view that enlarges an end portion in the long direction.

Hereinbelow, the action and effect of the cooling structure (R) for light emitting elements for a liquid crystal panel according to the first exemplary embodiment of the present invention shall be described, referring to FIGS. 1 to 4.

After the heat that is generated from each LED (2) is conveyed to the copper foil pattern that is formed on the front surface of the substrate (1), and further conveyed to the copper foil that is plated on the inner periphery of the through-hole (H), it is transmitted to the copper foil pattern that is formed on the rear surface of the substrate (1). Subsequently, the heat is transmitted from the rear surface of the substrate (1) to the chassis (4) via the thermally conductive sheet (3), and is released into the atmosphere by the heat dissipating function of this chassis (4).

Here, since the LEDs (2) are arranged in a linear manner at a fixed interval on the front surface of the long-shaped substrate (1), as described above, the temperature of the LEDs (2) has a tendency to become highest at the center portion in the long direction that is heated from both sides, and gradually become lower heading toward the end portions in the long direction. However, in the substrate (1) according to the first exemplary embodiment, as shown in FIG. 2 to FIG. 4, the through-holes (H) are densely provided in the center portion in the long direction, and the through-holes (H) are provided sparsely at the end portions in the long direction. Accordingly, at the center portion in the long direction where the temperature of the LEDs (2) is high, a large amount of the heat is conveyed from the LEDs (2) to the chassis (4) through the through-holes (H) that are provided at a high density, to be released into the atmosphere. On the other hand, at the end portions in the long direction where the temperature of the LEDs (2) is low, a small amount of the heat is conveyed from the LEDs (2) to the chassis (4) through the through-holes (H) that are arranged at a low density, to be released into the atmosphere. Thereby, since a temperature difference does not arise in the LEDs (2) at the center portion of the substrate (1) in the long direction thereof and the end portions of the substrate (1) in the long direction thereof, uniformity of brightness along the long direction is obtained, and it is possible to reduce the difference in longevity between the LEDs (2) at the center portion in the long direction and the LEDs (2) at the end portions in the long direction.

Next, a cooling structure for light emitting elements for a liquid crystal panel according to a second exemplary embodiment of the present invention shall be described. Compared to the first exemplary embodiment, the cooling structure for light emitting elements for a liquid crystal panel according to the second exemplary embodiment differs only in the constitution of the substrate. Since the constitutions other than that are the same as the first exemplary embodiment, the same reference symbols shall be used, and descriptions thereof shall be omitted here.

Figure 5:
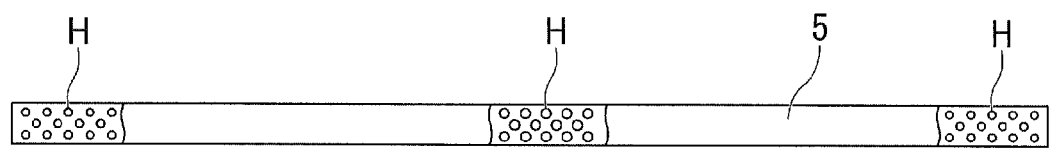
FIG. 5 is a schematic plan view that shows the constitution of a substrate according to a second exemplary embodiment of the present invention.

FIG. 5 is a schematic plan view that shows the constitution of a substrate (5) according to a second exemplary embodiment. It is the same as the first exemplary embodiment on the point of the through-holes (H) being formed in the substrate (5) along the entire length in the long direction, but the arrangement density is constant along the entire length in the long direction. In the present exemplary embodiment, each through-hole (H) has a cross-sectional shape that is approximately circular, but the diameter of the through-holes (H) at the center portion of the substrate (5) in the long direction thereof is formed larger than those at the end portions of the substrate in the long direction thereof.

According to this constitution, the surface area of the inside of the through-holes (H) at the center portion of the substrate (5) in the long direction thereof is larger, while the surface area of the inside of the through-holes (H) at the end portions in the long direction is smaller. Accordingly, at the center portion in the long direction where the temperature of the LEDs (2) is high, a large amount of the heat is conveyed from the LEDs (2) to the chassis (4) through the through-holes (H) that have a large surface area, to be released into the atmosphere. On the other hand, at the end portions in the long direction where the temperature of the LEDs (2) is low, a small amount of the heat is conveyed from the LEDs (2) to the chassis (4) through the through-holes (H) that only have a small surface area, to be released into the atmosphere. Thereby, the same effect as the first exemplary embodiment is obtained.

Next, a cooling structure for light emitting elements for a liquid crystal panel according to a third exemplary embodiment of the present invention shall be described. Compared to the first exemplary embodiment, the cooling structure for light emitting elements for a liquid crystal panel according to the third exemplary embodiment also differs only in the constitution of the substrate. Since the constitutions other than that are the same as the first exemplary embodiment, the same reference symbols shall be used, and descriptions thereof shall be omitted here.

Figure 6:
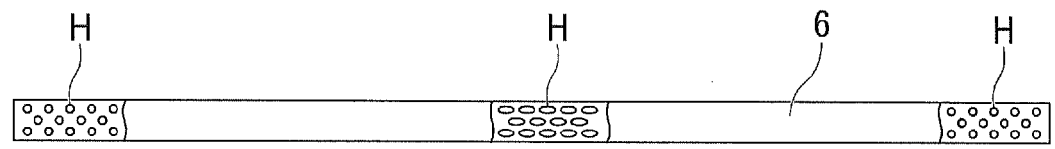
FIG. 6 is a plan view that shows another surface constitution example of a substrate that has through-holes, of a lighting system for a display device according to another exemplary embodiment of the present invention.

FIG. 6 is a schematic plan view that shows the constitution of a substrate (6) according to the third exemplary embodiment. It is the same as the first exemplary embodiment on the point of the through-holes (H) being formed in the substrate (6) along the entire length in the long direction, but the arrangement density is constant along the entire length in the long direction. In the present exemplary embodiment, the through-holes (H) have an approximately circular cross-sectional shape at the end portions of the substrate (6) in the long direction thereof, but the through-holes (H) at the center portion in the long direction have an approximately oblong cross-sectional shape.

According to this constitution, at the center portion of the substrate (6) in the long direction thereof, since the through-holes (H) have an approximately oblong cross-sectional shape, the surface area of the inside thereof is larger. On the other hand, and the end portions of the substrate (6) in the long direction thereof, since the through-holes (H) have an approximately circular cross-sectional shape, the surface area of the inside thereof is smaller. Thereby, the same action and effect as the second exemplary embodiment is obtained.

INDUSTRIAL APPLICABILITY

The present invention can also be applied to the case of adopting a light emitting element other than an LED as the light emitting element for a liquid crystal panel.

REFERENCE SYMBOLS

1 Substrate
2 LED (light emitting element)
3 Thermally conductive adhesive sheet
4 Chassis
5 Substrate
6 Substrate
R Cooling structure for light emitting elements for a liquid crystal panel
H Through-hole

The invention claimed is:

1. A cooling structure for light emitting elements for a liquid crystal panel, comprising:
a long-shaped substrate that is disposed so as to extend along an edge of a light guide plate provided on a rear surface of a liquid crystal panel, the substrate including a plurality of through-holes;
a plurality of light emitting elements that are disposed on a front surface of the substrate so as to face the light guide plate; and
a chassis that is provided at a rear surface side of the substrate,
the through-holes arranged at a higher density at a center portion of the substrate in a long direction of the substrate than at end portions of the substrate in the long direction.

2. The cooling structure for light emitting elements for a liquid crystal panel according to claim 1, wherein the light emitting elements comprise light emitting diodes.

3. The cooling structure for light emitting elements for a liquid crystal panel according to claim 1, wherein a density of the through-holes at the center portion is the highest in the substrate, and the density of the through-holes decreases from the center portion toward each of the end portions.

4. The cooling structure for light emitting elements for a liquid crystal panel according to claim 1, wherein a density of the through-holes at the center portion is the highest in the substrate.

5. A cooling structure for light emitting elements for a liquid crystal panel, comprising:
a long-shaped substrate that is disposed so as to extend along an edge of a light guide plate provided on a rear surface of a liquid crystal panel, the substrate including a plurality of through-holes;
a plurality of light emitting elements that are disposed on a front surface of the substrate so as to face the light guide plate; and
a chassis that is provided at a rear surface side of the substrate,
an internal surface area of the through-holes at a center portion of the substrate in a long direction of the substrate greater than an internal surface area of the through-holes at end portions of the substrate in the long direction.

6. The cooling structure for light emitting elements for a liquid crystal panel according to claim 5, wherein a cross-sectional shape of the through-holes at the center portion of the substrate in the long direction differs from a cross-sectional shape of the through-holes at the end portions of the substrate in the long direction.

7. The cooling structure for light emitting elements for a liquid crystal panel according to claim 6, wherein the through-holes have an approximately oblong cross-sectional shape at the center portion of the substrate in the long direction, and have an approximately circular cross-sectional shape at the end portions of the substrate in the long direction.

8. The cooling structure for light emitting elements for a liquid crystal panel according to claim 7, wherein the light emitting elements comprise light emitting diodes.

9. The cooling structure for light emitting elements for a liquid crystal panel according to claim 6, wherein the light emitting elements comprise light emitting diodes.

10. The cooling structure for light emitting elements for a liquid crystal panel according to claim 5, wherein the through-holes have an approximately circular cross-sectional shape, and a diameter of the through-holes at the center portion of the substrate in the long direction is greater than a diameter of the through-holes at the end portions of the substrate in the long direction.

11. The cooling structure for light emitting elements for a liquid crystal panel according to claim 10, wherein the light emitting elements comprise light emitting diodes.

12. The cooling structure for light emitting elements for a liquid crystal panel according to claim 5, wherein the light emitting elements comprise light emitting diodes.

13. The cooling structure for light emitting elements for a liquid crystal panel according to claim 5, wherein inner peripheries of the through-holes are plated with copper foil.

14. The cooling structure for light emitting elements for a liquid crystal panel according to claim 13, wherein a copper foil pattern is formed on a front surface of the substrate.

15. The cooling structure for light emitting elements for a liquid crystal panel according to claim 14, wherein a copper foil pattern is formed on a rear surface of the substrate which is an opposite side from the front surface.

16. The cooling structure for light emitting elements for a liquid crystal panel according to claim 15, wherein heat generated from the light emitting elements is conveyed to the copper foil pattern, and further conveyed to the copper foil that is plated on inner peripheries of the through-holes, and the heat is transmitted to the copper foil pattern that is formed on the rear surface of the substrate.

17. The cooling structure for light emitting elements for a liquid crystal panel according to claim 5, wherein the through-holes convey heat generated from the light emitting elements to the chassis.

18. The cooling structure for light emitting elements for a liquid crystal panel according to claim 5, wherein inner peripheries of the through-holes comprise copper foil,
    wherein a front surface of the substrate comprises a copper foil pattern, and,
    wherein a rear surface of the substrate which is an opposite side from the front surface comprises a copper foil pattern.

\* \* \* \* \*